US006762630B2

(12) United States Patent
Fibranz et al.

(10) Patent No.: US 6,762,630 B2
(45) Date of Patent: Jul. 13, 2004

(54) INTEGRATED CIRCUIT HAVING A SYNCHRONOUS AND AN ASYNCHRONOUS CIRCUIT AND METHOD FOR OPERATING SUCH AN INTEGRATED CIRCUIT

(75) Inventors: Heiko Fibranz, München (DE); Eckehard Plaettner, München (DE)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 10/033,123

(22) Filed: Oct. 22, 2001

(65) Prior Publication Data

US 2002/0067192 A1 Jun. 6, 2002

(30) Foreign Application Priority Data

Oct. 20, 2000 (DE) .......................................... 100 52 210

(51) Int. Cl.[7] .................................................. H03L 7/00
(52) U.S. Cl. ........................ 327/141; 327/144; 327/154; 327/165; 326/93
(58) Field of Search ................................. 327/141, 144, 327/145, 160, 151–154, 162, 166; 326/93; 375/354–356; 370/350, 503

(56) References Cited

U.S. PATENT DOCUMENTS

| | | | | |
|---|---|---|---|---|
| 4,263,673 A | * | 4/1981 | Bingham et al. | 375/117 |
| 4,759,014 A | * | 7/1988 | Decker et al. | 370/84 |
| 5,124,589 A | * | 6/1992 | Shiomi et al. | 326/43 |
| 5,131,013 A | * | 7/1992 | Choi | 375/118 |
| 5,268,934 A | * | 12/1993 | Sharma et al. | 375/117 |
| 5,274,680 A | * | 12/1993 | Sorton et al. | 375/118 |
| 5,325,404 A | * | 6/1994 | Bigey et al. | 375/354 |
| 5,337,334 A | * | 8/1994 | Molloy | 375/372 |
| 5,379,327 A | * | 1/1995 | Sharma et al. | 375/121 |
| 5,452,323 A | * | 9/1995 | Rosen | 375/354 |
| 5,487,092 A | * | 1/1996 | Finney et al. | 375/354 |
| 5,487,153 A | * | 1/1996 | Hammerstrom et al. | 395/250 |
| 5,509,124 A | * | 4/1996 | Bourke et al. | 395/280 |
| 5,522,048 A | * | 5/1996 | Offord | 395/280 |
| 5,579,526 A | * | 11/1996 | Watt | 395/800 |
| 5,694,588 A | | 12/1997 | Ohara et al. | 395/566 |
| 5,742,502 A | * | 4/1998 | King | 710/61 |
| 5,834,957 A | * | 11/1998 | Staton | 327/141 |
| 5,901,304 A | * | 5/1999 | Hwang et al. | 395/500 |
| 5,912,572 A | * | 6/1999 | Graf, III | 327/144 |
| 5,923,615 A | * | 7/1999 | Leach et al. | 365/238.5 |
| 6,026,465 A | * | 2/2000 | Mills et al. | 711/103 |
| 6,107,841 A | * | 8/2000 | Goodnow | 327/99 |
| 6,108,346 A | * | 8/2000 | Doucette et al. | 370/450 |

FOREIGN PATENT DOCUMENTS

JP 58 177 510 A 10/1983

* cited by examiner

Primary Examiner—Timothy P. Callahan
Assistant Examiner—Hai L. Nguyen
(74) Attorney, Agent, or Firm—Laurence A. Greenberg; Werner H. Stemer; Ralph E. Locher

(57) ABSTRACT

An integrated circuit has a synchronous circuit and an asynchronous circuit. A clock-controlled input register circuit and an output register circuit for storing data are each connected to the synchronous circuit and the asynchronous circuit. Data are transferred from the synchronous circuit into the input register circuit, from where they are transferred into the asynchronous circuit and processed in the asynchronous circuit. Processed data are transferred into the output register circuit. A sequence controller generates a respective control clock signal for the register circuits in a manner dependent on the data processing duration of the asynchronous circuit. This enables a high data throughput between the synchronous circuit and the asynchronous circuit independently of a clock frequency of the synchronous circuit.

7 Claims, 3 Drawing Sheets

INTEGRATED CIRCUIT HAVING A SYNCHRONOUS AND AN ASYNCHRONOUS CIRCUIT AND METHOD FOR OPERATING SUCH AN INTEGRATED CIRCUIT

BACKGROUND OF THE INVENTION

Field of the Invention

The present invention relates to an integrated circuit having a synchronous circuit and an asynchronous circuit and to a method for operating such an integrated circuit.

Integrated circuits often have synchronously operated and asynchronously operated circuit sections which are connected to one another for data exchange, for example. In this case, in the synchronously operated circuit sections are clock-controlled, in other words there is generally a globally available clock signal present by means of which the operation of the synchronous circuit section is controlled time-synchronously. In contrast to this, an asynchronously operated circuit section is not clock-controlled. Integrated circuits constructed in this way are found for example in the field of memory circuits, such as for instance, in the field of so-called embedded DRAMs (Dynamic Random Access Memories). In this case, by way of example, a DRAM memory circuit which essentially operates asynchronously is contained in an integrated circuit which additionally has synchronous circuit sections.

If different circuits which operate synchronously with respect to a clock signal and asynchronously, respectively, are used in an integrated circuit, then it is necessary to provide defined interfaces between the different circuits concerned. Clock-controlled register circuits are usually used for this purpose. In this case, data from a synchronous circuit are stored in an input register circuit with, for example, the rising edge of the clock signal. The data are transferred from the input register circuit into the relevant asynchronous circuit, the data are processed in the asynchronous circuit and forwarded to an output register circuit, into which the data are accepted upon the next rising edge of the clock signal. The data of the output register are transferred to the synchronous circuit for further processing.

In this case, difficulties may occur in particular if the data processing duration of the asynchronous circuit is longer than the period duration of the clock signal. This is because the input data for the asynchronous circuit that are to be stored in the input register circuit can change with the next rising edge of the clock signal. For proper operation of the integrated circuit, the input data must remain the same throughout the processing time of the asynchronous circuit, in order to ensure correct processing by the asynchronous circuit. In order to hold the input data for a plurality of clock cycles, it is necessary, for example, to provide an additional register in the synchronous circuit.

If it is established in this case, for example, that the synchronous circuit further processes the data from the output register circuit only after a defined number of clock cycles, this can have the effect that the synchronous circuit has to wait for an unnecessarily long time for the processed data of the asynchronous circuit for further processing. This can occur primarily in the case of variable clock frequencies of the synchronous circuit and can limit the data throughput.

SUMMARY OF THE INVENTION

It is accordingly an object of the invention to provide an integrated circuit having a synchronous circuit and an asynchronous circuit, and a method of operating the integrated circuit which overcomes the above-mentioned disadvantages of the prior art apparatus and methods of this general type. In particular, it is an object of the invention to provide an integrated circuit which enables a relatively high data throughput between the synchronous circuit and the asynchronous circuit.

With the foregoing and other objects in view there is provided, in accordance with the invention, an integrated circuit, that includes: a synchronous circuit; an asynchronous circuit; an input register circuit connected to the synchronous circuit and the asynchronous circuit, the input register circuit having a terminal receiving a first control clock signal for controlling data transfer; an output register circuit connected to the synchronous circuit and the asynchronous circuit, the output register circuit having a terminal receiving a second control clock signal for controlling data transfer; and a sequence controller. The synchronous circuit stores data in the input register circuit so that the data can be processed in the asynchronous circuit. The asynchronous circuit stores the processed data in the output register circuit so that the processed data can be further processed in the synchronous circuit. The sequence controller is connected to the asynchronous circuit for generating the first control clock signal and the second control clock signal in dependence on a duration required for the data to be processed in the asynchronous circuit.

With the foregoing and other objects in view there is also provided, in accordance with the invention, a method for operating the inventive integrated circuit, in which the first control clock signal is activated for the purpose of transferring data from the synchronous circuit into the input register circuit, the data are transferred from the input register circuit into the asynchronous circuit and are processed in the asynchronous circuit, the first control clock signal is inactivated by the sequence controller within the data processing duration of the asynchronous circuit, and in which the second control clock signal, at or after the end of the data processing duration of the asynchronous circuit, triggers transfer of the processed data into the output register circuit.

The integrated circuit and the operating method enable a comparatively high data throughput between the synchronous circuit and the asynchronous circuit. The data exchange between the asynchronous circuit and the synchronous circuit is adapted to the processing speed of the asynchronous circuit. This means, for example, that the synchronous circuit does not have to wait for a previously defined number of clock cycles for the result of the asynchronous circuit, which lowers the data throughput.

The fact that the first control clock signal is deactivated within the data processing duration of the asynchronous circuit avoids the situation in which data stored in the input register circuit are overwritten by new data of the synchronous circuit, as long as the asynchronous circuit has not yet concluded the processing of the old data. The fact that the second control clock signal, at or after the end of the data processing duration, triggers the transfer of the processed data into the output register circuit enables the further processing of the data to be carried out by the synchronous circuit immediately after the end of the processing in the asynchronous circuit. Besides the relatively high data throughput, in addition, a relatively simple design of the integrated circuit is made possible since there is no need for additional registers or circuits for holding or buffer-storing the input data.

In accordance with an added feature of the invention, the integrated circuit has a terminal for a clock signal, the terminal for the clock signal and the terminal for the first control clock signal are connected to one another via a controllable switching means. For generation of the first control clock signal, the controllable switching means can be controlled by the sequence controller. If the switching means is closed, then the clock signal forms the first control clock signal. If the switching means is open, then the first control clock signal is switched off or deactivated. This means that the integrated circuit itself switches off the first control clock signal by means of the sequence controller, in order to hold the data stored in the input register circuit, in order that the asynchronous circuit can carry out the data processing properly. The integrated circuit additionally determines, by means of the sequence controller, the instant that the data is output from the asynchronous circuit and the renewed switch-on of the first control clock signal.

Such a mode of operation of the integrated circuit is particularly advantageous for the case where the terminal for the clock signal is connected to the synchronous circuit for the purpose of controlling the operation of the synchronous circuit, and, in addition, the clock frequency of the clock signal is adjustable in a variable manner. A high data throughput is ensured in this case even in the event of an altered clock frequency of the clock signal and thus in the event of an altered data processing speed of the synchronous circuit. A comparatively slowly clocked design of the synchronous circuit can accept the data, for example, as early as after two clock periods, and a comparatively fast design of the synchronous circuit must wait for correspondingly more clock periods in order to accept the result of the asynchronous circuit. As a result, the data transfer between the synchronous circuit and the asynchronous circuit is adapted to the processing speed of the asynchronous circuit even in the event of an altered clock frequency of the clock signal, whereby a high data throughput is always achieved.

The invention can be used for diverse kinds of integrated circuits. By way of example, the asynchronous circuit has a memory circuit of the DRAM type. A comparatively high memory throughput is made possible with such a so-called embedded DRAM design. In addition, the integrated circuit can be used for the case where the asynchronous circuit has an analog/digital converter, for example.

Other features which are considered as characteristic for the invention are set forth in the appended claims.

Although the invention is illustrated and described herein as embodied in an integrated circuit having a synchronous and an asynchronous circuit and method for operating such an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
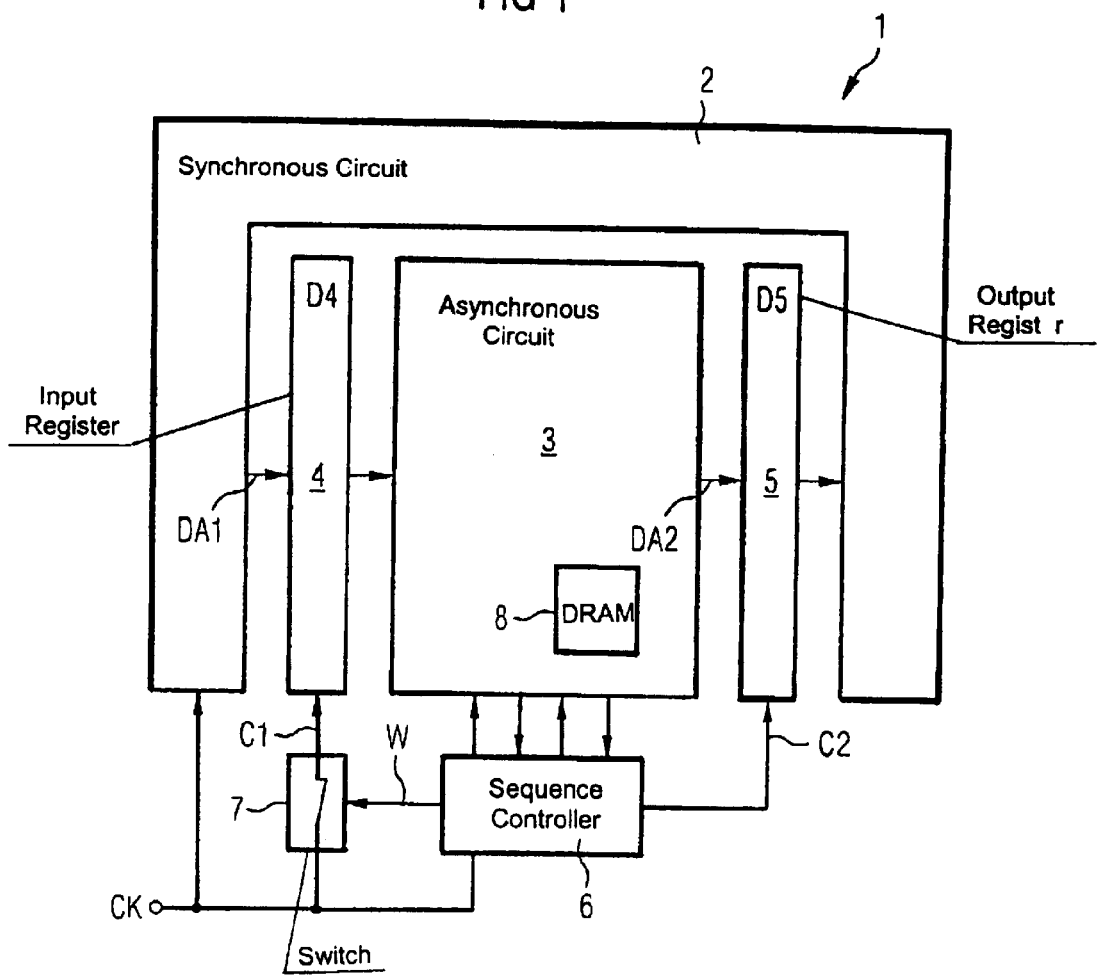
FIG. 1 shows an embodiment of an integrated circuit having a synchronous circuit and an asynchronous circuit.

Referring now to the figures of the drawing in detail and first, particularly, to FIG. 1 thereof, there is shown an embodiment of an integrated circuit 1 having a synchronous circuit 2 and an asynchronous circuit 3. An input register circuit 4 is connected to the synchronous circuit 2 and the asynchronous circuit 3. An output register circuit 5 is likewise connected to the synchronous circuit 2 and the asynchronous circuit 3. Data DA1 of the synchronous circuit 2, which are to be processed further in the asynchronous circuit 3, are stored in the input register circuit 4. The processed data DA2 of the asynchronous circuit 3 are stored in the output register circuit 5 in order to be processed further in the synchronous circuit 2. The asynchronous circuit 3 has a DRAM memory circuit 8 in this example.

The input register circuit 4 and the output register circuit 5 are clock-controlled in each case. The transfer of the data DA1 from the synchronous circuit 2 into the input register circuit 4 is controlled by means of the control clock signal C1, which is present at the input register circuit 4 for this purpose. The transfer of the data DA2 from the asynchronous circuit 3 into the output register circuit 5 is controlled by means of the control clock signal C2, which is present at the output register circuit 5 for this purpose.

The integrated circuit 1 additionally has a terminal for a clock signal CK which controls the operation of the synchronous circuit 2. The terminal for the clock signal CK is connected to the synchronous circuit 2, and, in addition, the terminal for the clock signal CK is connected to the terminal for the control clock signal C1 via the switch 7. The switch 7 can be controlled by the sequence controller 6 that is connected to the asynchronous circuit 3. The sequence controller 6 generates a control signal W for controlling the switch 7, and, in addition, generates the control clock signal C2 for controlling the output register circuit 5.

Figure 2:
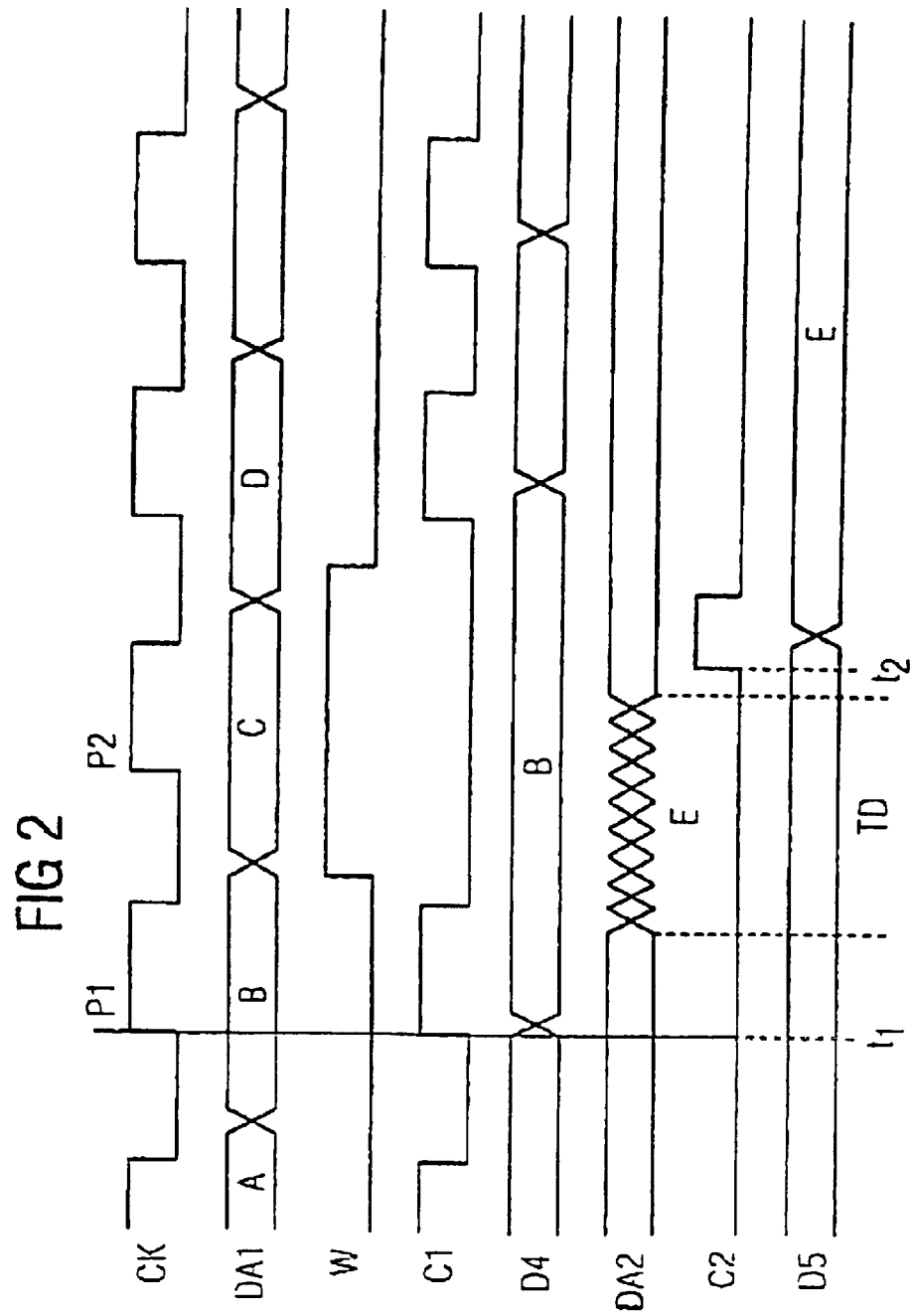
FIG. 2 shows a timing diagram of signals of the integrated circuit shown in FIG. 1.
Figure 3:
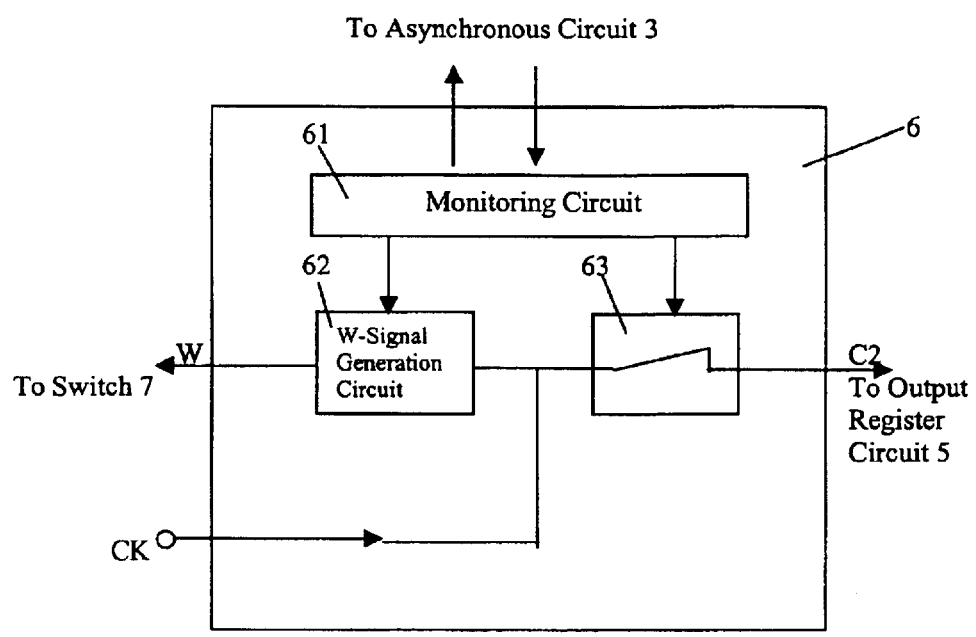
FIG. 3 shows a diagram of the structure of the sequence controller shown in FIG. 1.

FIG. 2 shows a timing diagram of the circuit shown in FIG. 1. The data DA1 are formed by the input data A, B, C and D. At the beginning of the data transfer from the synchronous circuit 2 into the asynchronous circuit 3, the switch 7 shown in FIG. 1 is closed. In order to transfer the data DA1 in the form of the input data B from the synchronous circuit 2 into the input register circuit 4, the control clock signal C1 has an active state (active high) at the instant t1. The input data B are stored in the input register circuit 4 as data D4. If the sequence controller 6 recognizes from the input data B, for example from a command, that the data processing in the asynchronous circuit will take a comparatively long time, it switches off the control clock signal C1 for the input register circuit 4. To that end, the control signal W is put into an active state (active high). The monitoring of the processing data duration of the asynchronous circuit is performed by the monitoring circuit 61 as shown in FIG. 3. The control signal W is set to an active or inactive state by the W-signal generation circuit 62. The consequence of this is that, in contrast to the clock period P1, in the clock period P2, no input data are transferred into the input register circuit 4. The "old" data D4 are still stored in the input register circuit 4 in order to be processed by the asynchronous circuit 3. To that end, the data D4 are transferred from the input register circuit 4 into the asynchronous circuit 3 and processed in the latter. On account of the control signal W, the control clock signal C1 is deactivated within the data processing duration TD of the asynchronous circuit 3.

Once the data have been completely processed in the asynchronous circuit 3, a clock pulse is generated in the form of the control clock signal C2 for the output register circuit 5. This operation is performed by the monitoring circuit 61 as shown in FIG. 3. If the monitoring circuit 61 detects that the data in the asynchronous circuit 3 are completely processed, it switches on the switch 63. As a result, the clock pulse CK is transferred in the form of the clock signal C2 to the output register circuit 5. In addition, the signal W is switched back into its inactive state. The control clock signal C2 can be activated at or after the end of the data processing duration TD of the asynchronous circuit 3 (instant t2). The data DA2 are transferred in the form of the processed output data E into the output register circuit 5 and stored (data D5). From the instant t2, the output data E are valid for further processing in the synchronous circuit 2.

The invention avoids the situation in which, in particular, the output data E are transferred into the output register circuit 5 within the data processing duration TD and can thus assume an undefined state. This is advantageous in particular when the clock frequency of the clock signal CK is adjustable in a variable manner.

The control clock signal C1 is deactivated by opening the switch 7 by means of the activated control signal W. When the control signal W is deactivated, care must be taken to ensure that no additional pulses arise on the control clock signal C1 for the input register circuit 4. For this reason, the signal W is deactivated in the inactive phase (low phase) of the clock signal CK and the switch 7 is closed in the inactive state of the clock signal CK. For the control of such a time sequence, the sequence controller 6 is connected to the terminal for the clock signal CK.

In the embodiment shown, the sequence controller 6 is arranged outside the asynchronous circuit 3. In a further embodiment of the integrated circuit, however, it is also possible for the sequence controller to be contained in the asynchronous circuit. As a result, the data transfer is performed via the input register circuit 4 and the output register circuit 5 by the asynchronous circuit 3 itself.

We claim:

1. An integrated circuit, comprising:
    a synchronous circuit;
    an asynchronous circuit;
    an input register circuit connected to said synchronous circuit and said asynchronous circuit, said input register circuit having a terminal receiving a first control clock signal for controlling data transfer;
    an output register circuit connected to said synchronous circuit and said asynchronous circuit, said output register circuit having a terminal receiving a second control clock signal for controlling data transfer; and
    a sequence controller;
    said input register circuit storing data of said synchronous circuit for processing in said asynchronous circuit;
    said output register circuit storing data of said asynchronous circuit for further processing in said synchronous circuit; and
    said sequence controller connected to said asynchronous circuit for generating the first control clock signal and the second control clock signal in dependence on a duration required for the data to be processed in said asynchronous circuit.

2. The integrated circuit according to claim 1, comprising:
    a terminal for receiving a clock signal; and
    a controllable switch switchably connecting together said terminal for receiving the clock signal and said terminal receiving the first control clock signal;
    said controllable switch being controlled by said sequence controller.

3. The integrated circuit according to claim 2, wherein:
    said terminal for receiving the clock signal is connected to said synchronous circuit and the clock signal controls operation of said synchronous circuit; and
    the clock signal has a variably adjustable clock frequency.

4. The integrated circuit according to claim 1, wherein said sequence controller is contained in said asynchronous circuit.

5. The integrated circuit according to claim 1, wherein said asynchronous circuit includes a DRAM.

6. A method for operating an integrated circuit, the method which comprises:
    activating a first control clock signal to transfer data from a synchronous circuit into an input register circuit;
    transferring the data from the input register circuit into an asynchronous circuit and processing the data in the asynchronous circuit to obtain processed data;
    with a sequence controller, inactivating the first control clock signal within the duration required for the data to be processed in the asynchronous circuit; and
    not earlier than a completion of the duration required for the data to be processed in the asynchronous circuit, using a second control clock signal to trigger transfer of the processed data into an output register circuit.

7. The method according to claim 6, which comprises:
    providing a terminal for receiving a clock signal having an active state and an inactive state;
    providing a controllable switch for switchably connecting together the terminal for receiving the clock signal and a terminal receiving the first control clock signal;
    inactivating the first control clock signal by opening the controllable switch; and
    using the sequence controller to close the controllable switch in the inactive state of the clock signal.

* * * * *